(12) United States Patent  
Tuers et al.

(10) Patent No.: US 9,361,030 B2  
(45) Date of Patent: Jun. 7, 2016

(54) TEMPERATURE ACCELERATED STRESS TIME

(71) Applicant: SanDisk Technologies Inc., Plano, TX (US)

(72) Inventors: Daniel E. Tuers, Kapaa, HI (US); Dana Lee, Saratoga, CA (US); Henry Chin, Milpitas, CA (US); Abhijeet Manohar, Bangalore (IN)

(73) Assignee: SanDisk Technologies Inc., Plano, TX (US)

( * ) Notice: Subject to any disclaimer, the term of this patent is extended or adjusted under 35 U.S.C. 154(b) by 53 days.

(21) Appl. No.: 14/510,771

(22) Filed: Oct. 9, 2014

(65) Prior Publication Data

US 2016/0054937 A1 Feb. 25, 2016

(30) Foreign Application Priority Data

Aug. 20, 2014 (IN) .......................... 4051/CHE/2014

(51) Int. Cl.
*G06F 12/00* (2006.01)
*G06F 3/06* (2006.01)

(52) U.S. Cl.
CPC ............ *G06F 3/0616* (2013.01); *G06F 3/0653* (2013.01); *G06F 3/0679* (2013.01)

(58) Field of Classification Search
None
See application file for complete search history.

(56) References Cited

U.S. PATENT DOCUMENTS

| 7,944,744 | B2 | 5/2011 | Bryant-Rich | |
|---|---|---|---|---|
| 2009/0319722 | A1* | 12/2009 | Murin | G11C 16/28 711/103 |
| 2013/0097368 | A1* | 4/2013 | Murin | G11C 16/28 711/103 |

* cited by examiner

*Primary Examiner* — Kevin Verbrugge
(74) *Attorney, Agent, or Firm* — Brinks Gilson & Lione

(57) ABSTRACT

A memory system or flash card may be exposed to elapsed time or increased temperature conditions which may degrade the memory. For example, extended time periods or high temperature conditions may hinder data retention in a memory device. An estimate of elapsed time and temperature conditions may be useful for memory management. An algorithm that periodically identifies one or more sentinel blocks in the memory device and measures the data retention shift in those sentinel blocks can calculate a scalar value that approximates the combined effect of elapsed time and/or temperature conditions.

20 Claims, 14 Drawing Sheets

1802 - Measured time & temp
1804 - Interpolated via delta of minima from sentinel
1806 - Arrow 4, Periodic power state evaluation not shown, but done every 5 min.

TEMPERATURE ACCELERATED STRESS TIME

PRIORITY

This application claims priority to India Application 4051/CHE/2014, filed on Aug. 20, 2014, entitled "TEMPERATURE ACCELERATED STRESS TIME", the entire disclosure of which is hereby incorporated by reference.

TECHNICAL FIELD

This application relates generally to memory devices. More specifically, this application relates to the approximation of elapsed time and/or temperature using a scalar calculated from data retention measurements in a sentinel block within non-volatile semiconductor flash memory.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Time and temperature may hinder data retention (DR) in a memory device. Increased time and/or temperature may cause a device to wear more quickly and/or lose data (i.e. data retention loss). Devices that are placed in long term storage or slumber may not effectively estimate the amount of elapsed time in the power absent or reduced power states. It may be beneficial for the long term health of the memory device to know the elapsed time and/or temperature that the memory device is exposed to.

SUMMARY

A memory system or flash card may be exposed to elapsed time or increased temperature conditions which may degrade the memory. For example, extended time periods or high temperature conditions may hinder data retention in a memory device. An estimate of elapsed time and temperature conditions may be useful for memory management. An algorithm that periodically identifies one or more sentinel blocks in the memory device and measures the data retention shift in those sentinel blocks can calculate a scalar value that approximates the combined effect of elapsed time and/or temperature conditions.

DESCRIPTION OF THE EMBODIMENTS

Elapsed time and/or increased temperatures may result in a decrease in data retention (DR) in a flash memory device. This may occur when the device is in a powered state as well as when the device is in a lower power state or powered off. Since elapsed time and increased temperature may both hinder DR, they may be viewed as a single variable that hurts DR. For example, less time at a higher temperature may be equivalent to more time at a lower temperature in terms of the measurable negative effect on the functionality of the device (e.g. reduced DR). As described below, a scalar may be calculated with an algorithm that identifies one or more sentinel blocks in the memory device and monitors DR shift of those sentinel blocks. The scalar correlates to elapsed time and temperature conditions that the memory device is exposed to.

The calculated scalar is an estimate of the combination of elapsed time and temperature conditions of the memory device, which can then be used in order to maintain data for maximum life expectancy. The elapsed time information may be used to create a log for failure analysis (FA) purposes. Allocated blocks may be tested periodically for the ability to retain data and may be used as information purposes for future usage allocation. The scalar estimate may also be used as an early warning of block life expectancy. As described below, the scalar may be referred to as a total life scalar that can estimate a device's useful life expectancy and can be used to trigger many alternative flash management schemes, including scrub handling. The scrub bit error rate (BER) threshold may be set low based on the frequency of the read scrub patrol. Scrubbing data earlier than necessary may lead to excessive program/erase (P/E) cycling which may cause the device to fail earlier. The proposed system and method may be more intelligent about the patrol frequency by using a calculation of time and temperature both in a powered and powerless state.

Figure 1:
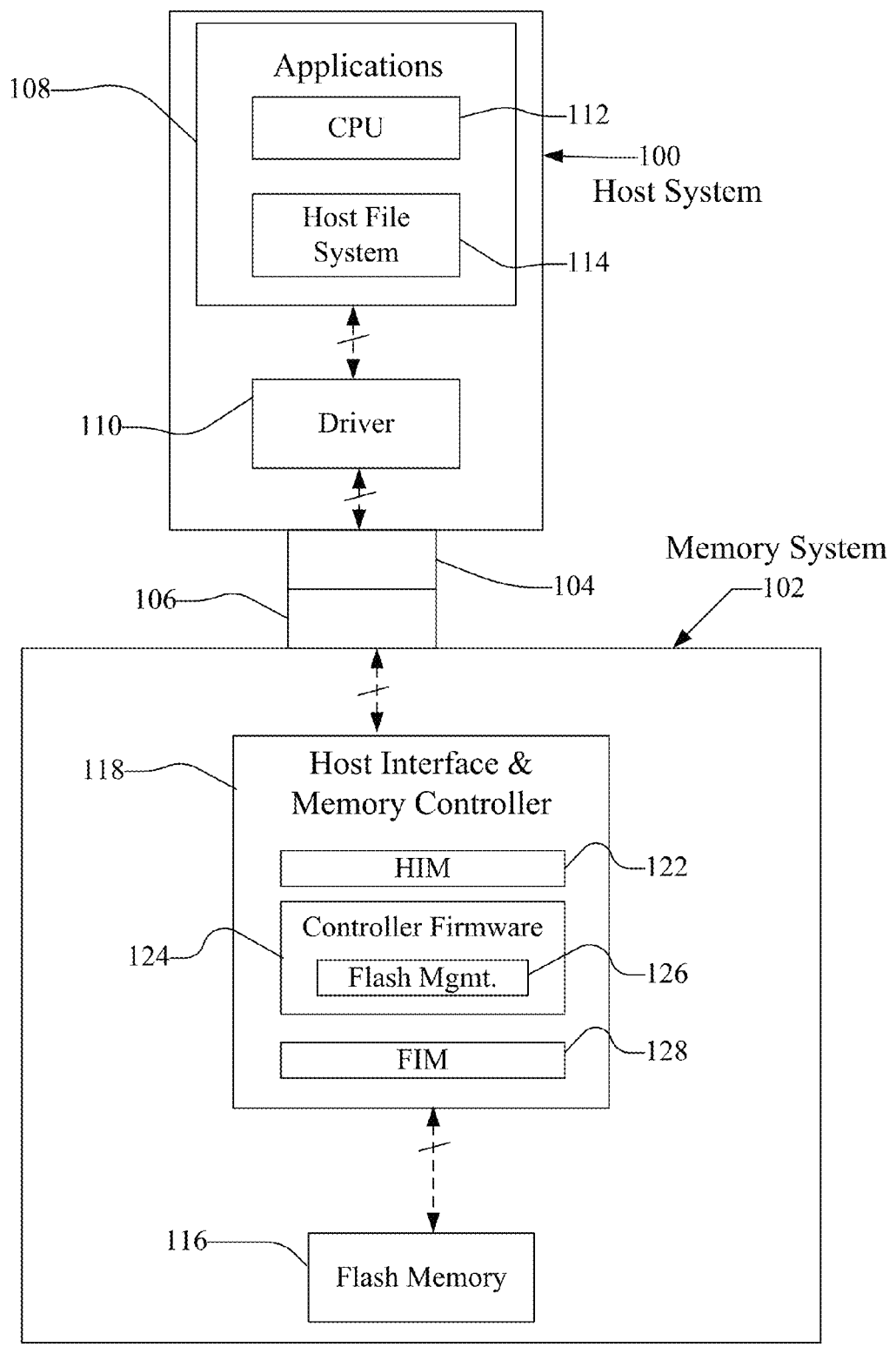
FIG. 1 is a block diagram of a host connected with a memory system having non-volatile memory.

A flash memory system suitable for use in implementing aspects of the invention is shown in FIGS. 1-5. In particular, the algorithm with sentinel block identification and the scalar calculations may be for the flash memory device(s) shown in FIGS. 1-5. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module 128. Flash management logic 126 may be part of the controller firmware 214 for internal memory management operations such as garbage collection. One or more flash interface modules (FIMs) 128 may provide a communication interface between the controller with the flash memory 116.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may be needed because: 1) the flash memory may have limited endurance; 2) the flash memory 116 may only be written in multiples of pages; and/or 3) the flash memory 116 may not be written unless it is erased as a block. The FTL understands these potential limitations of the flash memory 116 which may not be visible to the host 100. Accordingly, the FTL attempts to translate the writes from host 100 into writes into the flash memory 116.

As described below, one or blocks from the flash memory 116 may be identified as sentinel blocks. Those blocks are monitored and data retention (DR) shift is measured for those blocks. Based on the DR shift of the sentinel blocks, an algorithm may calculate one or more scalar values that can correlate with the environment (elapsed time and temperature conditions) exposed to the flash memory 116.

Figure 2:
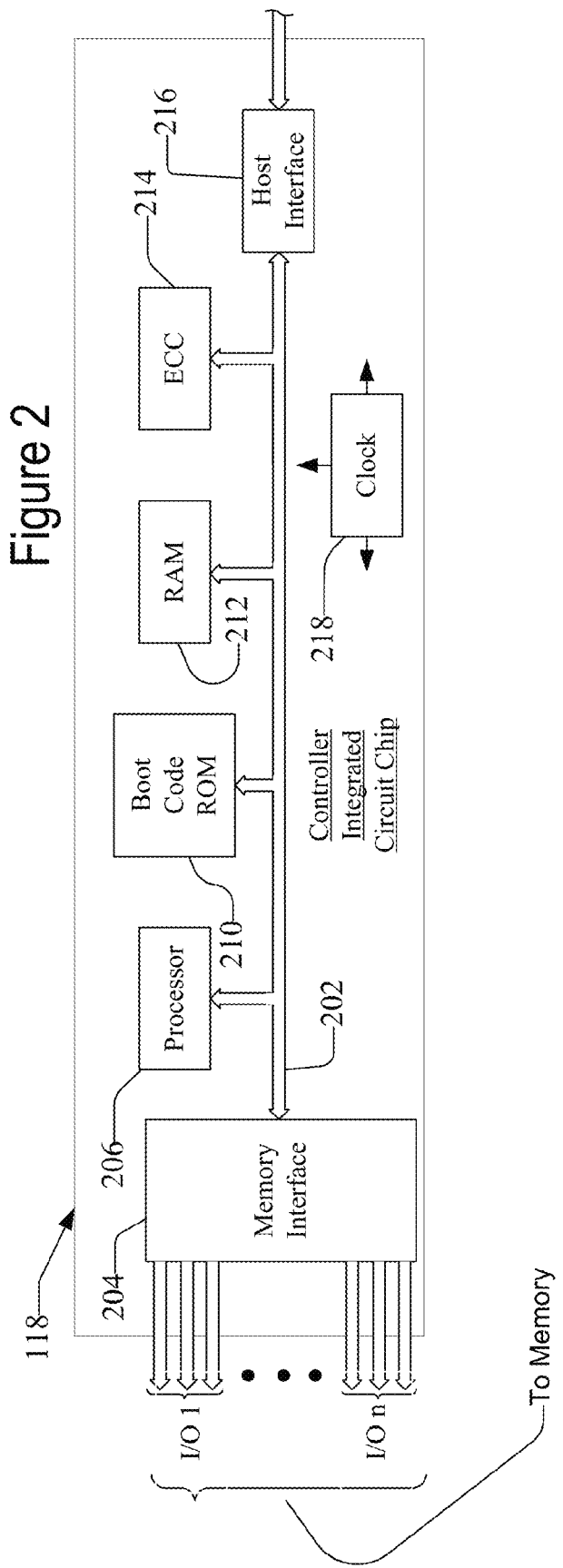
FIG. 2 is a block diagram of an exemplary flash memory device controller for use in the system of FIG. 1.

The device controller 118 may be implemented on a single integrated circuit chip, such as an application specific integrated circuit (ASIC) such as shown in FIG. 2. The processor 206 of the device controller 118 may be configured as a multi-thread processor capable of communicating via a memory interface 204 having I/O ports for each memory bank in the flash memory 116. The device controller 118 may include an internal clock 218. The processor 206 communicates with an error correction code (ECC) module 214, a RAM buffer 212, a host interface 216, and boot code ROM 210 via an internal data bus 202. The host interface 216 may provide the data connection with the host. The memory interface 204 may be one or more FIMs 128 from FIG. 1. The memory interface 204 allows the device controller 118 to communicate with the flash memory 116. The RAM 212 may be a static random-access memory (SRAM). The ROM 210 may be used to initialize a memory system 102, such as a flash memory device. The memory system 102 that is initialized may be referred to as a card. The ROM 210 in FIG. 2 may be a region of read only memory whose purpose is to provide boot code to the RAM for processing a program, such as the initialization and booting of the memory system 102. The ROM may be present in the ASIC rather than the flash memory chip. The operation of the algorithm that identifies the sentinel blocks and/or calculates a scalar representing time/temperature conditions may be performed by the device controller 118. In an alternative embodiment, the host may perform the algorithm.

Figure 3:
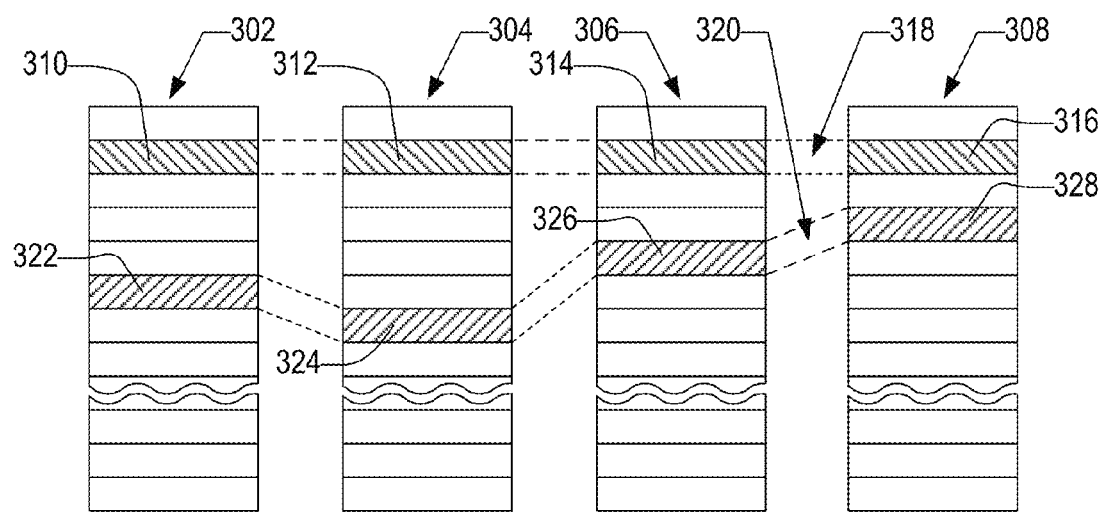
FIG. 3 is an example physical memory organization of the system of FIG. 1.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation. As described below, the sentinel blocks may be an individual block or a combination of blocks, including one or more metablocks.

Figure 4:
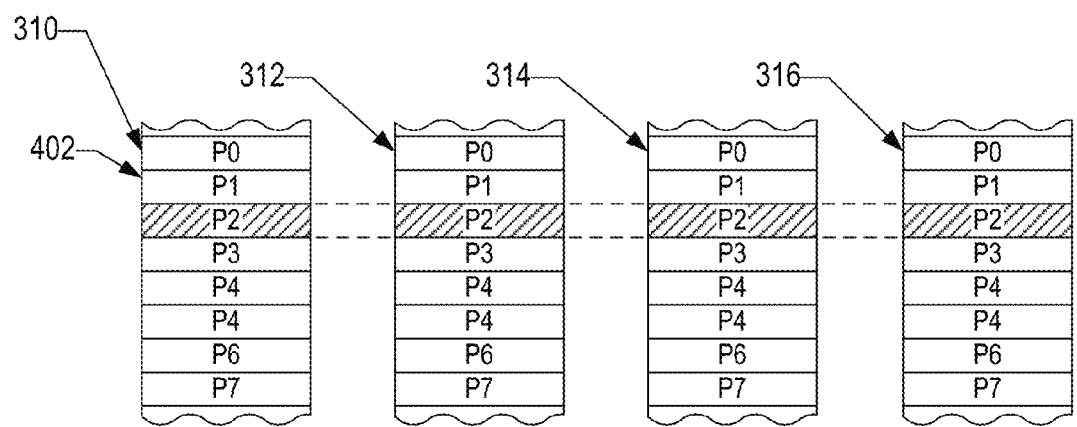
FIG. 4 is an expanded view of a portion of the physical memory of FIG. 3.

The individual blocks are in turn divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 4, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 5:
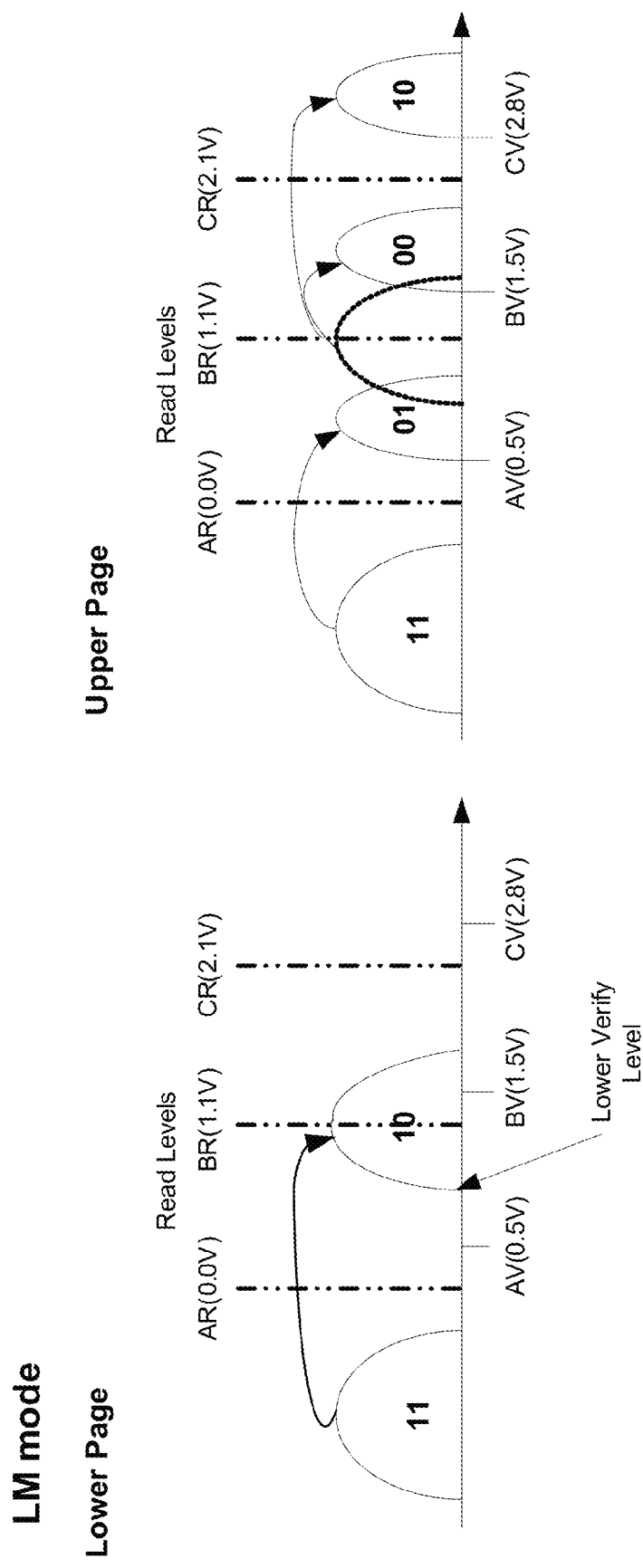
FIG. 5 is a diagram illustrating charge levels in a multi-level cell memory operated to store two bits of data in a memory cell.

FIG. 5 illustrates one implementation of the four charge levels used to represent two bits of data in a memory cell. FIG. 5 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Electrons for each of the charge values may be lost over time, which may eventually result in data loss. Increased temperatures may accelerate the electron loss. Likewise, extended time or exposure to high temperatures may result in a shift of the levels (i.e. thresholds) shown in FIG. 5. In particular, this shift may result in a measurable movement of the sense threshold minima. This level shift may result in a change of a value (e.g. from a value of 1 to 0 in a particular cell) which is an example of a DR failure. In other words, DR problems may be caused in part by the environmental changes. Increased temperature may further cause the charge in a particular cell to move levels.

Figure 6:
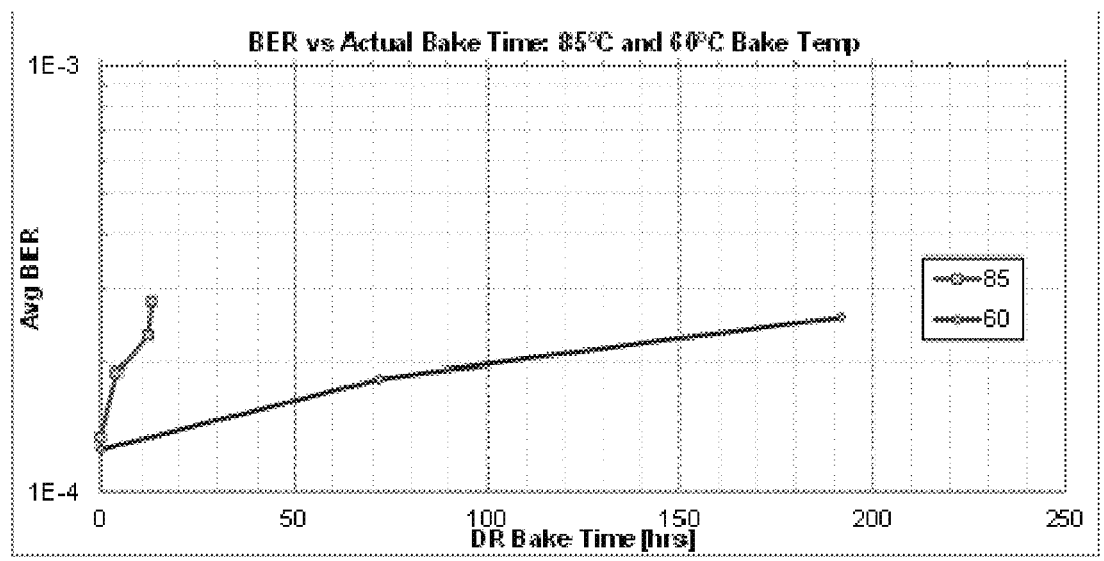
FIG. 6 is a diagram illustrating time and temperature effects.

FIG. 6 is a diagram illustrating time and temperature effects. FIG. 6 illustrates that an extended time period at a lower temperature (60 Celsius) may be equivalent to a shorter period at a higher temperature (85 Celsius). The y-axis is the Bit Error Rate (BER) and corresponds to errors in the memory, while the x-axis illustrates bake time in hours. FIG. 6 illustrates the idea that higher temperatures result in more errors for the memory.

DR shift may be affected by several factors such as total cycles, cycling rate, elapsed time and elapsed temperature. Accordingly, DR shift may provide a glimpse into the environment of the device during a powerless state (e.g. hours in a hot car or years at room temperature). This environment is estimated with the calculation a scalar value that reflects the environment (temperature and elapsed time).

A sentinel block may be an erased block that may have gone through higher cycling. In one embodiment, a sentinel block is a block that is about to be compacted or has just been compacted. Alternatively, the sentinel block may be a block pulled from the pool that has a slightly higher cycle count than the entire flash pool and is due for a garbage collection. After the data has been compacted to a new block, instead of erasing the block and returning it to the free pool the block is identified/assigned as a sentinel block. Alternatively, the block may be erased and some redundant copy (or simple random pattern) of information may be encoded via the ECC engine and stored in the sentinel block. The sentinel block may be an example of what the data will look like in the future (because the sentinel block has gone through higher cycling). In addition, the sentinel block may be representative of other blocks because there is a less linear correlation of time/temperature to data retention just after the block is programmed as compared to the later part of a blocks retention period.

New sentinel blocks (plural) may be continually identified/assigned and reallocated in order to have a head start on the cycle count. The selection/identification of sentinel blocks may be periodic and continuous, so that there are multiple start times (i.e. times of selection/identification) as well as multiple measurements. In one embodiment, a different/new sentinel block is identified after a certain amount of time (e.g. every 10 seconds, 10 minutes, 10 hours, etc. . . . ). There are not just measurements at power down, but multiple start times that result in multiple measurements. The sentinel blocks may be scattered throughout the flash memory for increased variance.

Several sentinel blocks may be used at any given time to represent cold data that is simply drifting and not getting cycled. A new sentinel block may be preemptively launched after an elapsed time measured by a powered on clock or measured by feedback from the system or based on hot count/cycle periods. After the sentinel block reaches the end of its useful retention life, it may be returned back to the free pool where it is probably used several times to catch up to the hot count of the rest of the system.

When the device resumes (either for a power on reset or out from a slumber) it will do a Cell Voltage Distributions (CVD) read of the data stored in the sentinel block and compare the CVD read thresholds against the thresholds measured either at the last power on or the before slumber. This data may be stored in the non-volatile memory space and used to approximate total elapsed time. It may be added to a value stored in the flash memory and may store the updated time back to the flash.

The estimated elapsed time can be used for several system functions, including: 1) scrub management; 2) other background tasks; or 3) power-less state profiling. The elapsed scalar may be used to profile the power-less states. If the device recognizes that it normally goes through several comfortable power less states followed by an extremely long (harsh, i.e. high temperature) power less state, it may elevate the priority of the foreground scrub. If the host protocol allows, the device may possibly notify the host that the device should be maintained in a powered on state in order to preserve the integrity of the data.

Blocks can be periodically checked for valid DR by assigning them as temporary sentinels every X P/E cycles (where X represents a set number of cycles). When the hot count reaches a certain value, after the block is erased it may be placed on a temporary sentinel retention list instead of returning immediately to the free pool. Then, the first few wordlines (WLs) are programmed. The device's total life scalar is used to create a timer that is then used to check the block's DR after a period of time. The block's thresholds are tested against other similar blocks to determine how much DR the block went through during this quarantine period. If the block shows irregularity, then further tests may be done on the block to determine if the block has become unhealthy because unhealthy blocks may be treated differently than healthy blocks.

Figure 7:
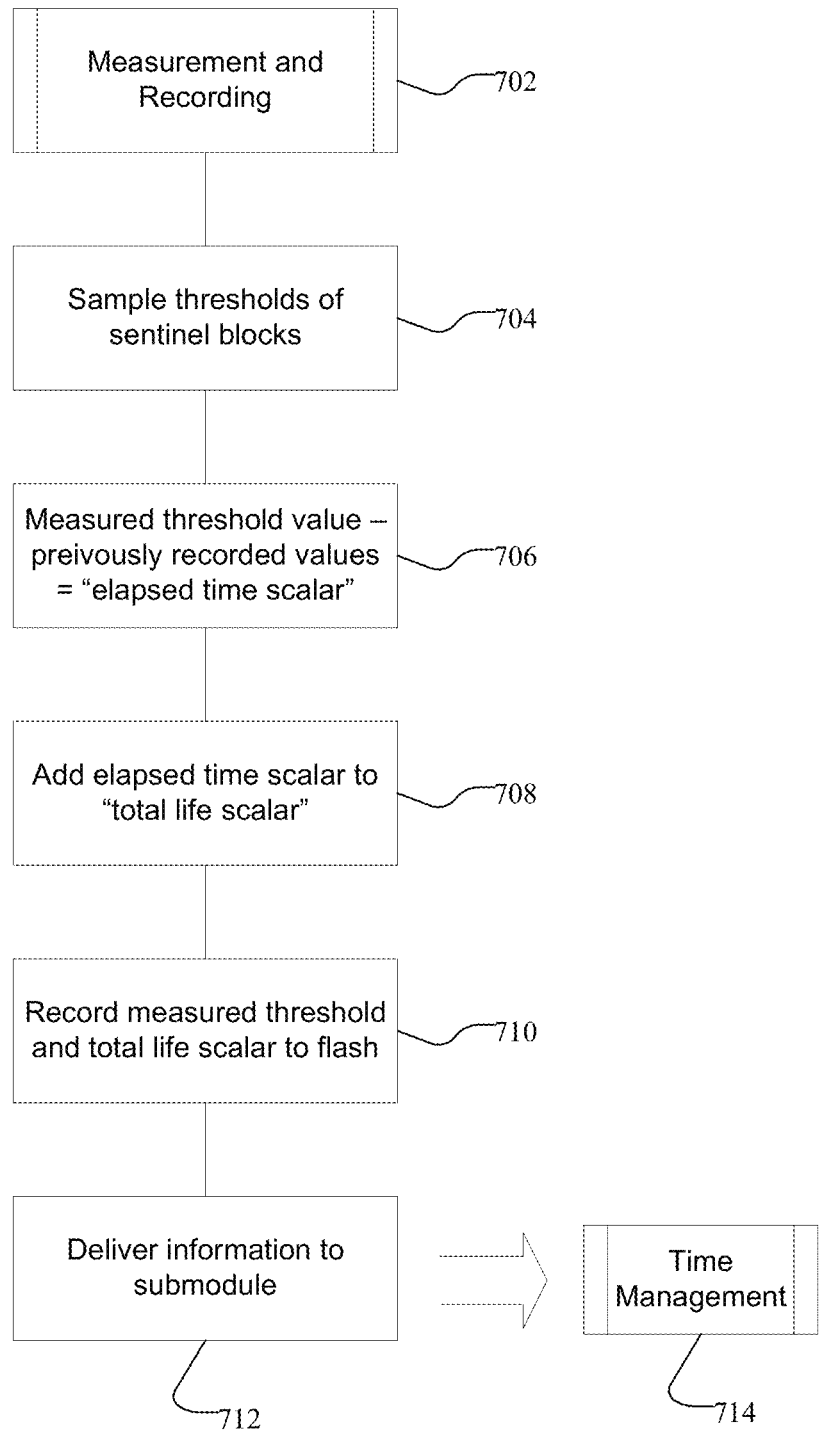
FIG. 7 is a flowchart illustrating the gathering and recording of scalar information.

FIG. 7 is a flowchart illustrating the gathering and recording of scalar information. In block 702, the measurement and recording of scalar information is started through this exemplary algorithm. Sentinel blocks are identified as further described in FIG. 10 and thresholds for those sentinel blocks are sampled in block 704. As described with respect to FIG. 5 the threshold may be the level at which a cell is triggered (e.g. a voltage level that results in a change in value). DR may be reduced over time or at high temperatures due to electrons escaping and the voltage decreasing (which may result in a change in value for a cell that should not have changed value). In block 706, the measured threshold value is subtracted from previously recorded values to record the difference in the threshold values. As described with respect to FIG. 11, the thresholds for each sentinel block is periodically measured and logged. This log records the threshold measurements that are used for then calculating the difference in threshold values shown in block 706. The difference between the current threshold value and the most recently measured threshold value for a given sentinel block is referred to as an "elapsed time scalar." In one embodiment, the elapsed time scalar may be calculated from an average of several measurements. In alternative embodiments, the elapsed time scalar may be calculated from a maximum measured value.

While the elapsed time scalar represents an impact of environment (e.g. elapsed time and temperature) over a set time period (i.e. the time period between measurements of the sentinel block), a "total life scalar" may represent a cumulative impact of environment on the device. In block 708, each calculated elapsed time scalar is added to the total life scalar. The total life scalar that is periodically recorded may provide a glimpse to the environment the memory device went through. For example, if the device went through an extended period of time without power, or the device was used in harsh (i.e. hot) environment with long slumber or power-less periods, then the total life scalar should reflect that environment. In particular, the total life scalar may be a linear clock of a lifetime for a particular sentinel block that accumulates the elapsed time scalars for that sentinel block from the time that the sentinel block is identified/assigned as a sentinel block. The scalar values may be stored to the flash memory in block 710, which is further described with respect to FIG. 11. In block 712, the scalar information for both the elapsed time scalar and total life scalar may be delivered to the time management module in block 714 as described with respect to FIG. 8.

Figure 8:
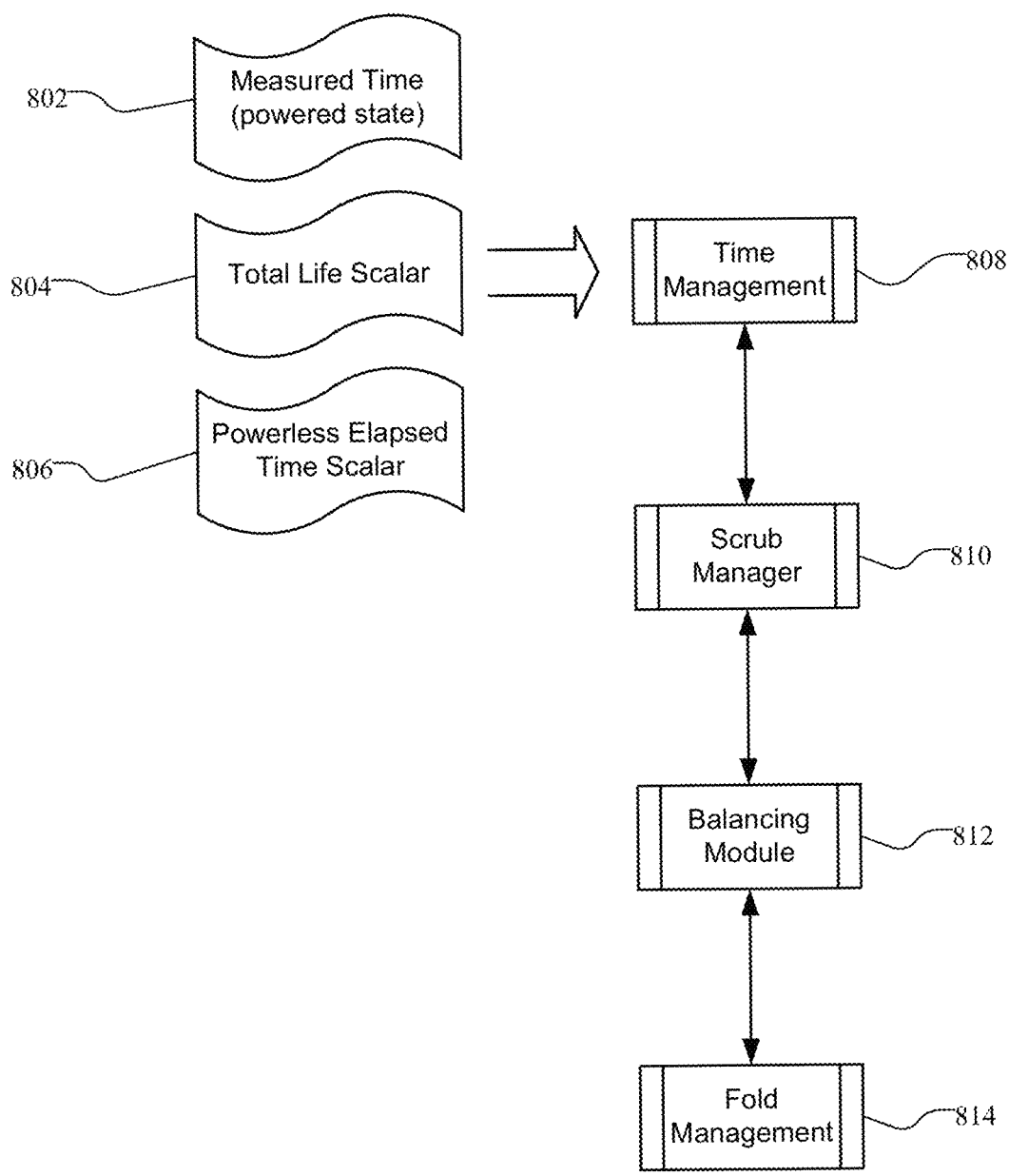
FIG. 8 is a flowchart illustrating time management.

FIG. 8 is a flowchart illustrating time management. In particular, FIG. 8 illustrates that the measured time (during a powered state) 802, the total life scalar 804, and the elapsed time scalar (from a powerless state) 806 may be used for different functions within the memory device. Time management 808 may refer to changes that are made to the memory device based on the data regarding environment (i.e. the scalars and measured time). Scrub manager 810 is a scrub operation that may be modified based on the environment data and is further described with respect to FIG. 9. Balancing module 812 is a modification of data storage and fold management 814 is a change to the taking of data from SLC to MLC, both of which may be modified based on the environment data and are further described with respect to FIG. 16.

Figure 9:
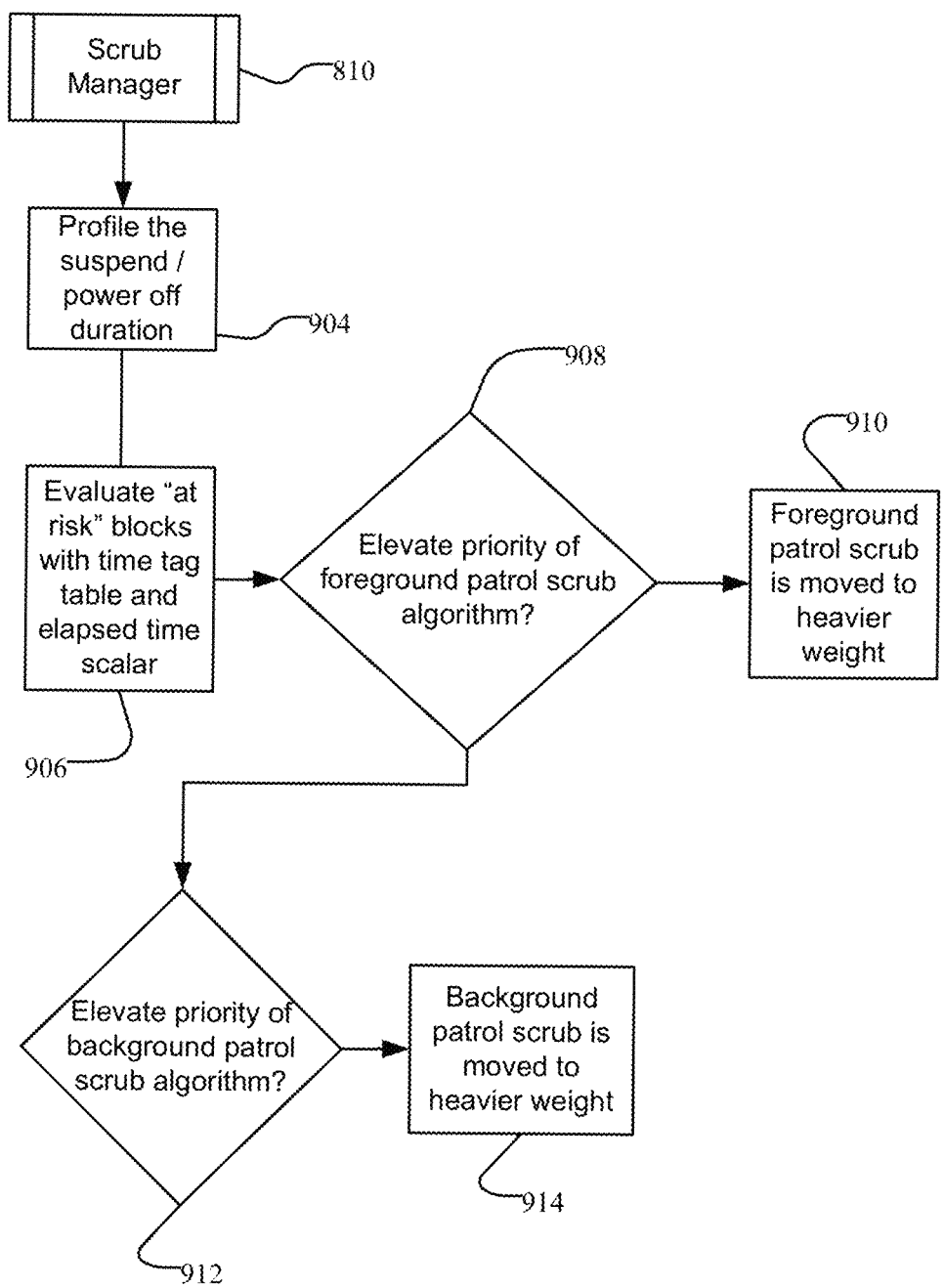
FIG. 9 is a flowchart illustrating scrub management 810.

FIG. 9 is a flowchart illustrating scrub management 810. In block 904, a suspended or powered off state duration may be profiled. If the device went through a long powerless state, that information may be identified from the scalars. In block

906, at risk blocks are evaluated with a time tag table and with the elapsed time scalar. At risk blocks may be those that have a higher elapsed time scalar. If any blocks are at immediate risk indicated by the elapsed time scalar, then the priority of the foreground patrol scrub algorithm may be elevated in block 908. In block 910, the foreground patrol scrub (foreground=host read/write) may be prioritized such that the host is notified that the drive is preserving data and should be powered for a longer duration. In block 912, the priority of the background patrol scrub algorithm may be elevated, such that the background patrol scrub is prioritized in block 914.

The power off scalar can be used to create a profile of power down time and environment to better handle long term storage of data. For example, the memory device may identify the mean and max power off times and using the block's health, it may predict if the data should be scrubbed aggressively, which may include recycling/compaction algorithm changes to recycle data before the block's end of life to avoid data loss during a potential powered off period. Another aggressive recycling algorithm may be before a host graceful power down which triggers that compaction should be performed. In another embodiment, a log may be kept of the unpowered time for file allocation (FA) purposes.

To cover the event of a non-graceful shutdown, the system may utilize a periodic evaluation of sentinel blocks. Logging of information on graceful power down/suspend may be optional. If the protocol permits enough time to do an evaluation of the sentinel blocks on suspend/power down, then the evaluation may be more accurate than relying on the last periodic log. The period of evaluation of time and temperature in a powered on state may differ from the period of evaluating the sentinel blocks. The process time to evaluate time and temperature may be very quick, and may be done periodically (e.g. on the order of every 5 minutes in one embodiment). The time it takes to evaluate the sentinel blocks and create a log may be large and may be done less frequently to minimize time and log storage space (e.g. on the order of every 4 hours in one embodiment). The period for evaluating sentinel blocks may be dynamically adjusted based on the results.

Figure 10:
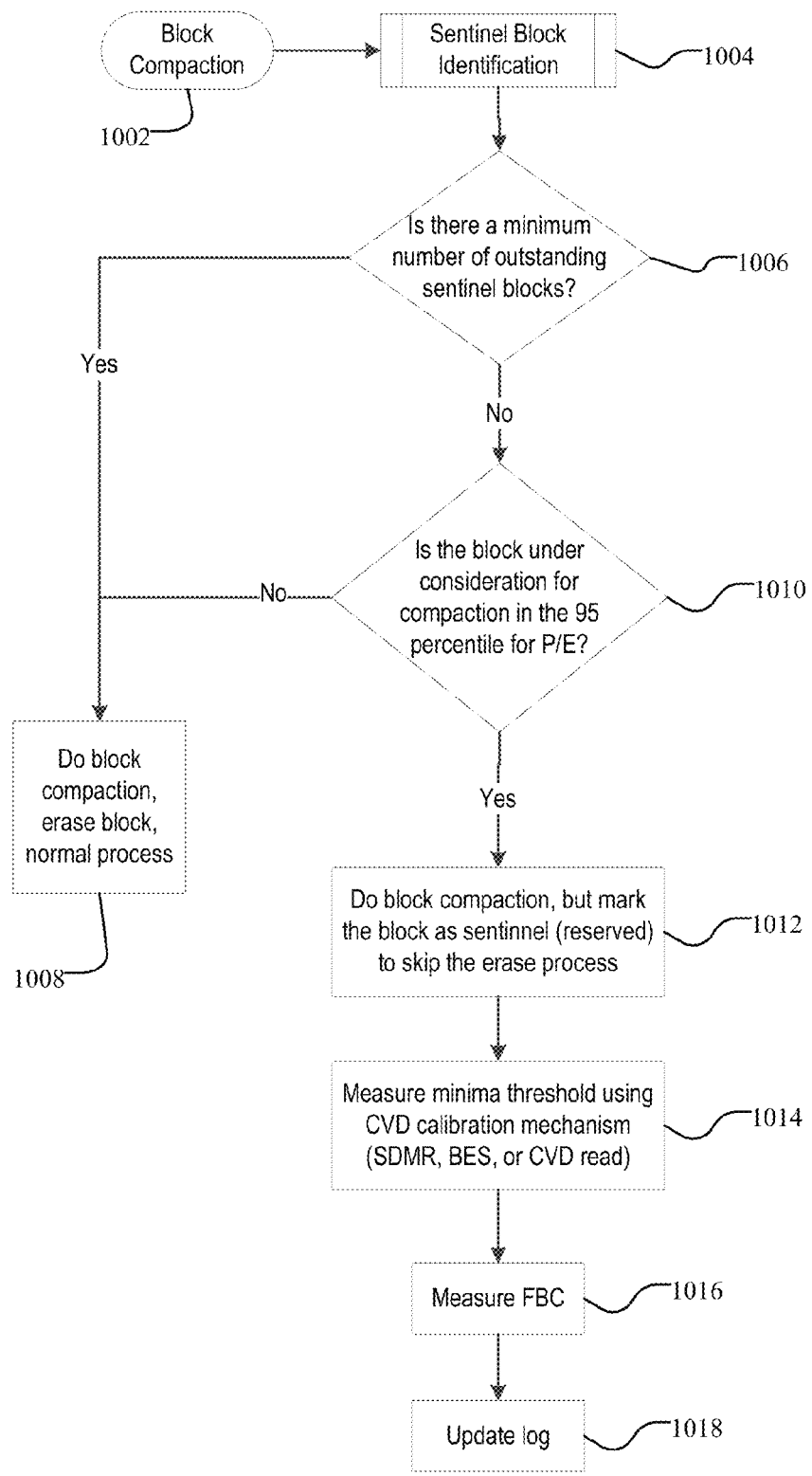
FIG. 10 is a flowchart illustrating sentinel block identification.

FIG. 10 is a flowchart illustrating sentinel block identification. In one embodiment, sentinel block identification/assignment 1004 may be based on the timing of block compaction 1002 or garbage collection. A block that is set to be compacted or just compacted may be eligible to be a sentinel block. In block 1006, a check is performed on the total number of outstanding sentinel blocks. If there is already a minimum number, then block compaction and block erasing proceeds as normal in block 1008. When there is a need for additional sentinels, then a determination is made as to whether a block is under consideration for compaction in a certain percentile (e.g. 95 percentile) for program/erase (P/E) cycles in block 1010. If the block does not satisfy those conditions, then block compaction and block erasing proceeds as normal in block 1008. If the block meets the requirements in block 1010, then block compaction is performed, but the block is marked as a sentinel block so that the erase process is skipped in block 1012. The minima threshold is then measured used CVD calibration in block 1014 and the flip bit count (FBC) or BER are measured for the sentinel block in block 1016. The threshold and FBC is then recorded in the log in block 1018.

The log for the sentinel blocks may include the scalar measurements and is updated and stored in flash memory. An exemplary log is shown in Table 1 below:

TABLE 1

Exemplary Log

| Group | Field | Width (bits) | Notes |
|---|---|---|---|
| Log Header | Log Code | 8 | 0 - Periodic Trigger, 1 - Power On Trigger 2 - Sentinel Failure |
| | Total Life Scalar | 32 | Current value at time of log |
| Sentinel Entry (repeated) | Sentinel Block ID | 32 | |
| | Age | 32 | Based on TLS |
| | Log Index for Sentinel Block | 16 | FFFF indicates retirement, |
| | FBC | 16 | Current value measured, FFFF indicates failure |
| | Minima Thresholds | 64 (8 bytes) | In DACs |

The exemplary log in Table 1 includes a log code that identifies why this log was created. It may be created due to a periodic trigger (value=0), due to a power on (value=1), or due to sentinel failure (value=2). The total life scalar is also recorded based on its current value at the time the log is recorded. The remainder of the log in Table 1 includes entries for each of the sentinel blocks. The sentinel block entries may include an identification of the sentinel block, an age of the sentinel block, and a log index for the sentinel block. In addition, the flip bit count (FBC) or bit error rate (BER) of the sentinel block is recorded along with the minima thresholds.

Figure 11:
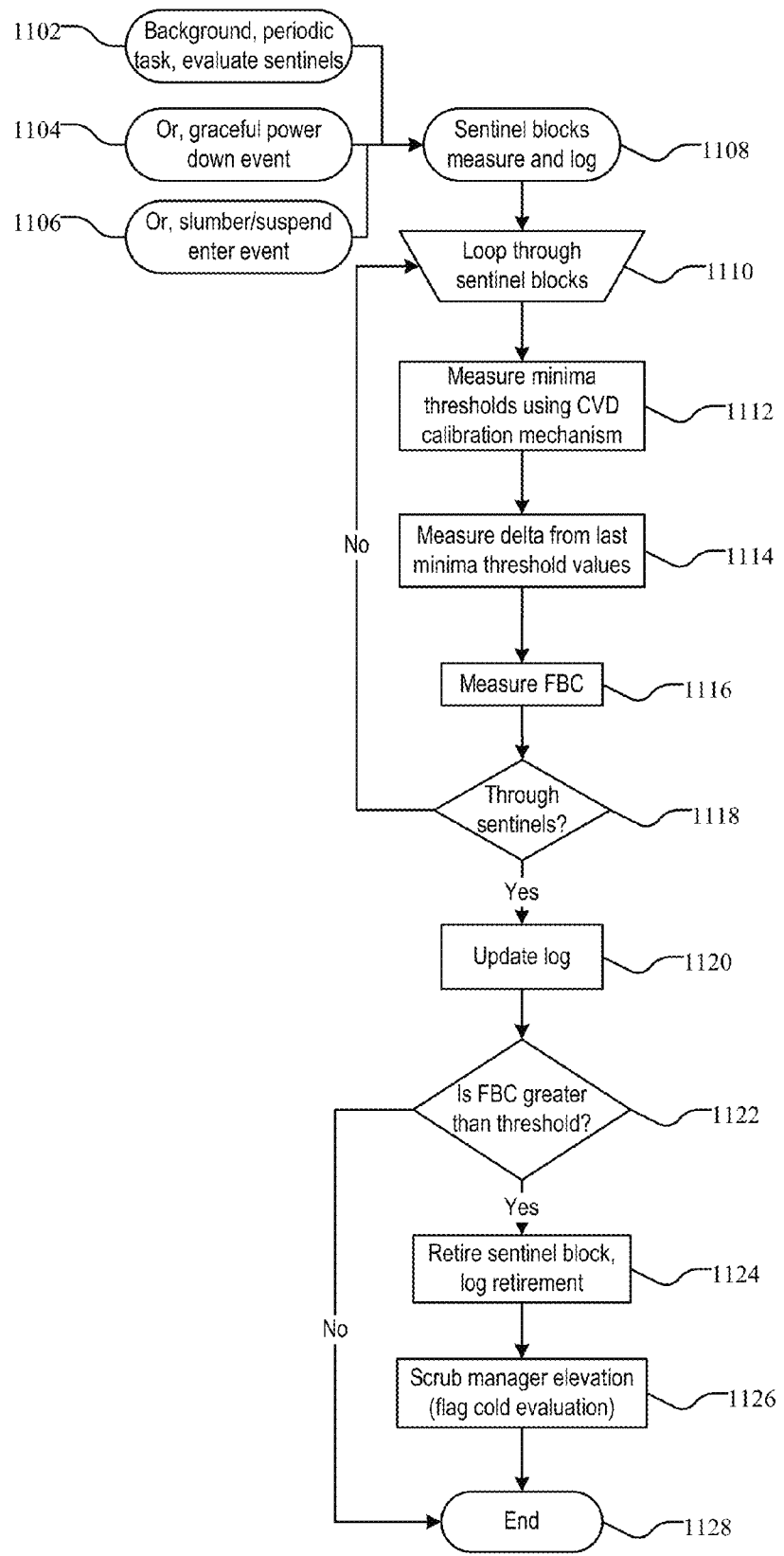
FIG. 11 is a flowchart illustrating sentinel block measurement and logging.

FIG. 11 is a flowchart illustrating sentinel block measurement and logging. An exemplary log is illustrated in Table 1 and FIG. 11 illustrates an exemplary embodiment for the logging of sentinel block measurements and may be the same as or overlap with certain steps shown in FIG. 10. There may be a number of events that trigger sentinel blocks being measured and logged as in block 1108. For example, background or periodic tasks 1102, graceful power down events 1104, and/or slumber/suspend events 1106. In block 1110, there is a loop through the sentinel blocks that were already identified/assigned (as in FIG. 10). Minima thresholds using CVD calibration mechanism are measured for each sentinel block as in block 1112. The difference/delta is measured between the current minima threshold and the most recent minima threshold value in block 1114. The FBC is measured in block 1116. If there are still sentinels to be evaluated in block 1118, then the loop 1110 cycles through each sentinel block. When all sentinel blocks have been looped, the log is updated in block 1120. The log may be the log shown in Table 1 in one embodiment. Using the log, a measurement is made to compare the FBC value with a threshold value in block 1122. The threshold may be established by the error correction code (ECC) range. In one embodiment, if the FBC is too great than it cannot be measured. If the FBC is not greater than the threshold, then the operation completes 1128. If the FBC exceeds the threshold, then the sentinel block is retired in block 1124 and scrub manager is run in block 1126. The sentinel block may be returned to a normal usage block upon retirement.

Figure 12:
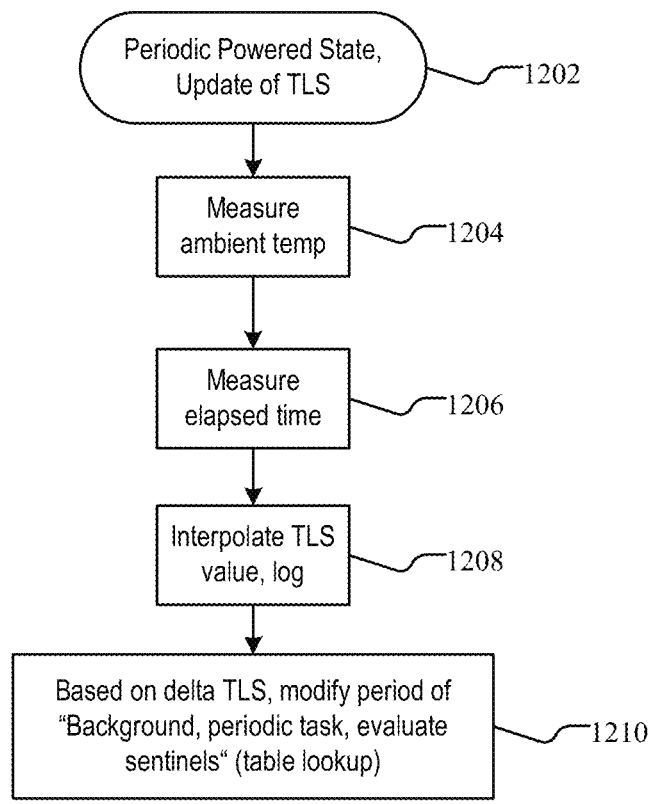
FIG. 12 is a flowchart illustrating a periodic powered state process.

FIG. 12 is a flowchart illustrating a periodic powered state process 1202. An ambient temperature may be measured in block 1204, such as through temperature sensor on the board or NAND. The elapsed time may be measured in block 1206, such as through an internal clock which starts from zero at power on. The total life scalar (TLS) may be interpolated and logged in block 1208 and based on the measured ambient temperature and elapsed time. The interpolated value of the total life scalar may be logged and a delta TLS (difference in the total life scalar) may be calculated and used to modify the timing by which sentinel blocks may be measured as in block 1210. When in a power on state, the time and temperature may be measured as in FIG. 12. However, when the memory device is in a powered down or sleep state, there may be no way to measure temperature and calculate elapsed time, which is why the scalar information is recorded and utilized as described.

Figure 13:
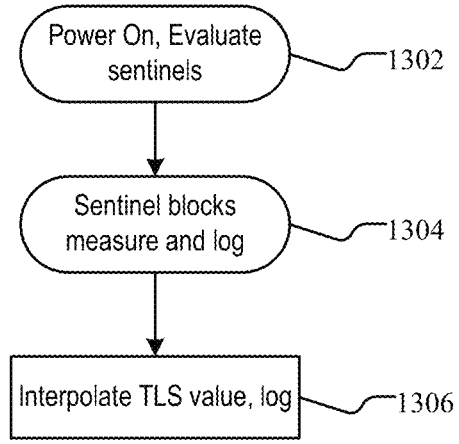
FIG. 13 is a flowchart illustrating a power on process.

FIG. 13 is a flowchart illustrating a power on process 1302. As soon as the device is powered on, the sentinel blocks may be measured and the log may be updated as in block 1304. The measurement may include ambient temperature, elapsed time, FBC, and/or minima threshold. Further, the total life scalar value may be interpolated and logged as in block 1306 and described above with respect to FIG. 12. The interpolation value may be used as a baseline value in one embodiment.

Figure 14:
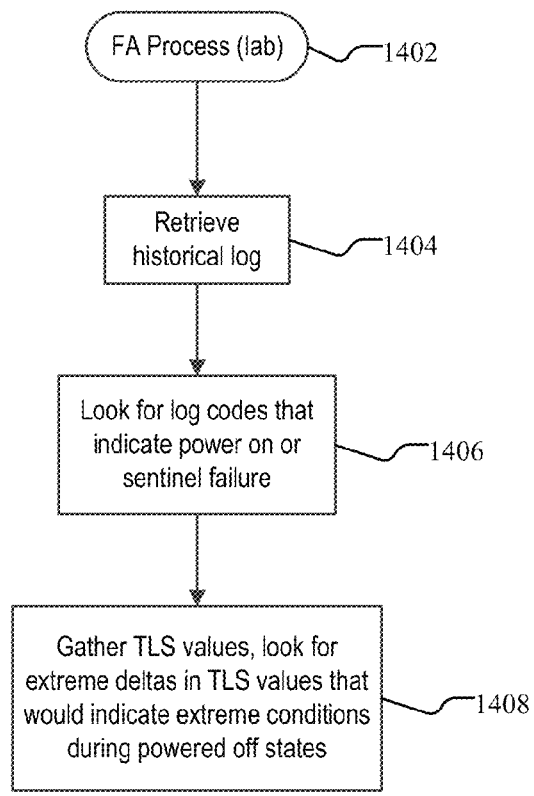
FIG. 14 is a flowchart illustrating failure analysis.

FIG. 14 is a flowchart illustrating failure analysis. The failure analysis (FA) may be a process for analyzing a device that failed as in block 1402. The log may be retrieved from the device in block 1404 and log codes are analyzed that may indicate power on or sentinel block failures in block 1406. The total life scalar values are analyzed along with the differences/deltas in the total life scalar values that may indicate extreme conditions during a power off state in block 1408.

Figure 15:
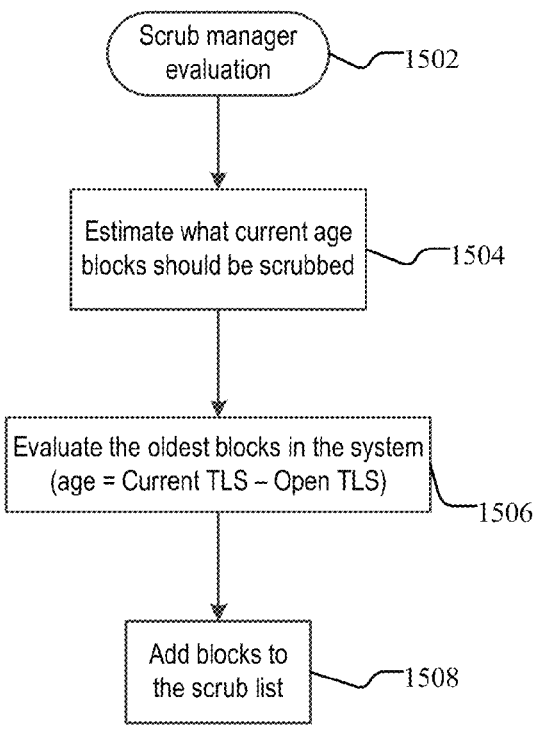
FIG. 15 is a flowchart illustrating scrub manager evaluation.

FIG. 15 is a flowchart illustrating scrub manager evaluation 1502. The current age of the blocks that should be scrubbed is estimated in block 1504. The evaluation may include the current temperature environment, which sentinels that may have recently reached the marginal period, historical powerless elapsed time scalars, and/or product DR requirements. The oldest blocks in the system are evaluated in block 1506. For example, the age may be the difference between the current total life scalar and the old total life scalar. When a block is erased and first programmed, the current total life scalar is recorded (i.e. similar to a "born on" date/tag), so that the delta/difference between the current total life scalar and the date the block was opened is the block's age. The oldest blocks may then be added to the scrub list in block 1508. The scrub may be performed during idle time and there may be bins that are established based on age. Each block may be assigned an age bin and the bin with the oldest age may be scrubbed.

Figure 16:
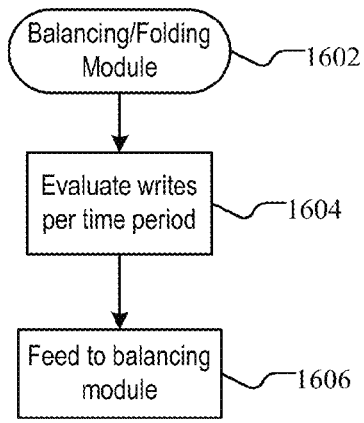
FIG. 16 is a flowchart illustrating the balancing/folding module.

FIG. 16 is a flowchart illustrating the balancing/folding module 1602. The writes per time period is evaluated in block 1604 and provided to the balancing module in block 1606. The folding process may include transitioning data from SLC to MLC. Balancing may include slowing down the speed of the folding process. A series of data is collected to evaluate the number of writes over several time periods. The time elapsed during powered off states may affect the evaluation algorithm and may help evaluate scrubs by folding the data to low endurance (e.g. cold blocks). In other words, the folding and balancing may be a process that is modified based on the estimated environment (i.e. elapsed time and temperature).

Figure 17:
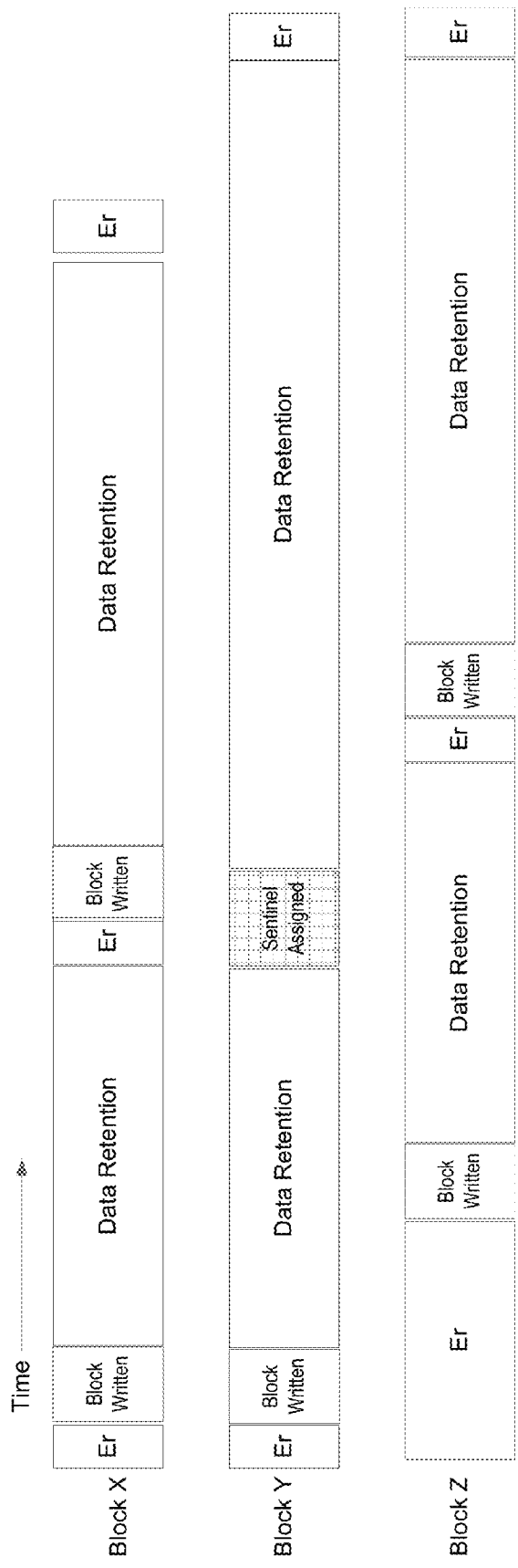
FIG. 17 is a timing diagram for exemplary blocks.

FIG. 17 is a timing diagram for exemplary blocks. Three blocks (X, Y, Z) are shown with time as the x-axis. Writing, erasing (Er), and data retention are shown over time. Block Y is an exemplary block that is illustrated as being identified/assigned as a sentinel block. As discussed, the sentinel identification/assignment (e.g. described with respect to FIG. 10) may be before or after compaction.

Figure 18:
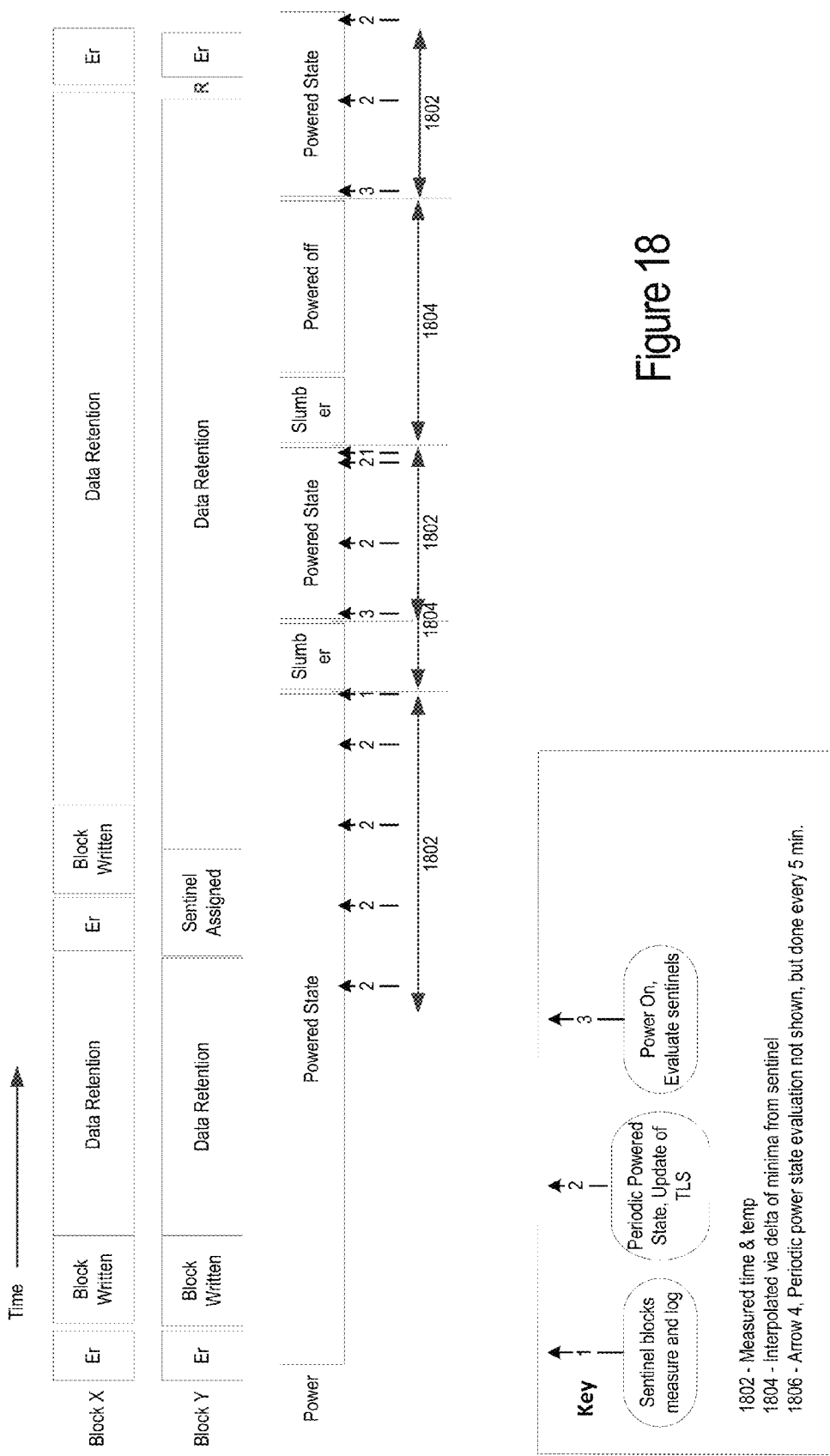
FIG. 18 is a timing diagram for exemplary block evaluation.

FIG. 18 is a timing diagram for exemplary block evaluation for timing similar to that shown in FIG. 17. The timing in FIG. 18 is shown along with the power status. The power status may be in a powered state, a slumber state (inactive), or a powered off state. As shown by the key in FIG. 18, the periodic updates of the total life scalar (TLS) may occur as labeled by 2. When a change in state occurs (e.g. as labeled by 1), the sentinel blocks may be measured and logged. When the device is powered on (e.g. as labeled by 3), the sentinels may be evaluated and compared with the measurements from before the slumber state or from before the powered off state. The sentinel assignment illustrated for Block Y is assigned because the data of block Y may be older than the data of Block X, and Block Y may have a higher P/E count. Accordingly, because Block Y is assigned as a sentinel, it is not erased when Block X is erased. Near the end of the shown timeline for Block Y, Block Y may be retired (R) as a sentinel block when the sentinel's FBC is higher than the margin, which then triggers an evaluation of Block X for retention.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method in a storage device having memory blocks that store data, the method comprising:
   identifying sentinel blocks from the memory blocks, wherein the sentinel blocks are due for compaction and have a higher program/erase count; and
   monitoring the sentinel blocks to estimate an environmental effect.

2. The method of claim 1 wherein the identifying occurs periodically.

3. The method of claim 2 wherein a minimum number of the sentinel blocks are maintained through the periodic identifying.

4. The method of claim 3 wherein the identifying occurs during a power state change.

5. The method of claim 1 wherein the storage device comprises a three-dimensional (3D) memory configuration, and wherein a controller is associated with operation of the memory blocks.

6. The method of claim 1 wherein the estimate of the environmental effect comprises a total life scalar value that is calculated based on changes to minima threshold values in the sentinel blocks.

7. The method of claim 6 wherein the environmental effect comprises an effect from elapsed time and temperature.

8. The method of claim 6 wherein the total life scalar comprises an accumulation of each change in the minima threshold values.

9. The method of claim 6 further comprising:
   storing a log that includes an identification for each of the sentinel blocks; and
   updating the total life scalar value in the log.

10. The method of claim 9 wherein the log further comprises at least one of an age, a flip bit count, or the minima threshold values.

11. The method of claim 1 wherein scrub management, or fold/balance management are modified based on the estimated environmental effect.

12. A method for estimating environmental effects in a memory device having blocks of memory, wherein the method:
   assigns at least one of the blocks as representative blocks;
   computing a scalar value based on a data retention (DR) shift of the representative blocks; and
   estimating an elapsed time or a temperature exposure based on the scalar value.

13. The method of claim 12 wherein the representative blocks comprise sentinel blocks that have the DR shift representative of the blocks of memory.

14. The method of claim 13 wherein the sentinel blocks are identified because they are due for compaction and have a higher program/erase count.

15. The method of claim 13 wherein the DR shift comprises changes to a minima threshold value of the sentinel blocks.

16. The method of claim 15 wherein the scalar value comprises a total life scalar that comprises an accumulation of changes to the minima threshold values of the sentinel blocks.

17. The method of claim 16 wherein total value scalar is stored in a log that is updated periodically.

18. The method of claim 17 wherein the log stores an identifier for each of the sentinel blocks and the minima threshold values for those sentinel blocks.

19. The method of claim 16 wherein total value scalar is stored in a log that is updated based on changes to a power state.

20. A flash memory device with memory blocks storing data and a controller in communication with the memory blocks, wherein the controller is configured to:
   identify one or more sentinel blocks from the memory blocks, wherein the sentinel blocks are ready for compaction and have a higher program/erase count;
   monitor the sentinel blocks by recording minima threshold values of the sentinel blocks that are stored in a log;
   update a scalar value in the log, wherein the scalar value comprises an accumulation of changes to the recorded minima threshold values, further wherein the minima threshold values comprise data retention shifts; and
   adjust at least one operation of the flash memory device based on the scalar value.

\* \* \* \* \*